United States Patent

Hori et al.

[11] Patent Number: 5,980,684
[45] Date of Patent: Nov. 9, 1999

[54] PROCESSING APPARATUS FOR SUBSTRATES

[75] Inventors: Hisashi Hori; Yoshitsugu Kawamura; Kazuto Obuchi, all of Kanagawa, Japan

[73] Assignee: Tokyo Ohka Co., Ltd., Kawaski, Japan

[21] Appl. No.: 08/965,437

[22] Filed: Nov. 6, 1997

[30] Foreign Application Priority Data

Nov. 13, 1996 [JP] Japan .................................. 8-301400

[51] Int. Cl.$^6$ .................................................. C23C 16/00
[52] U.S. Cl. ........................................... 156/345; 118/719
[58] Field of Search ............................. 156/345; 118/719

[56] References Cited

U.S. PATENT DOCUMENTS 4,433,951  2/1984  Koch ........................................ 414/217
4,503,807  3/1985  Nakayama ............................... 118/719

FOREIGN PATENT DOCUMENTS 209150  1/1987  European Pat. Off. ............... 118/719

*Primary Examiner*—Richard Bueker
*Attorney, Agent, or Firm*—Merchant, Gould, Smith, Edell, Welter, Schmidt, P.A.

[57] ABSTRACT

For shortening the time for introducing an inactive gas, such as nitrogen gas, into a load lock chamber of a processing apparatus for substrates, a buffer tank 19 having a capacity larger than that of the load lock chamber is provided in the path of a pipe for introducing the nitrogen gas into the load lock chamber 3 of the processing apparatus. During processing within the processing chamber 2, such as an ashing process and so on, the nitrogen gas is introduced into the load lock chamber 3 from the buffer tank 19 by operating a valve mechanism 21 to increase the pressure within the load lock chamber 3 up to atmospheric pressure.

3 Claims, 2 Drawing Sheets

PROCESSING APPARATUS FOR SUBSTRATES

BACKGROUND OF THE INVENTION

1. Field of the Invention

The present invention relates to an apparatus for treating or processing a substrate, such as a semiconductor wafer or a glass substrate, etc., with the so-called an ashing process under a condition of reduced pressure.

2. Description of Related Art

For conducting processes under a reduced pressure condition, such as an ashing process, upon a substrate with high efficiency, a processing apparatus has already been known which is provided with a load lock chamber within a processing chamber thereof.

The procedure in accordance with this processing apparatus is that, while a substrate is treated in the processing chamber, another substrate to be treated next is placed into the load lock chamber for waiting, in which chamber the pressure is also reduced down to the same level as that of the processing chamber. When the process or treatment within the processing chamber is completed, the unprocessed substrate waiting in the load lock chamber is brought into the processing chamber, while the substrate processed in the processing chamber is taken out therefrom, and then the processing chamber is insulated from the load lock chamber by a shutter. After that, another shutter insulating the load lock chamber from an outer space is opened so as to bring out the processed substrate from the load lock chamber and also to bring a new substrate into the load lock chamber.

SUMMARY OF THE INVENTION

In the processing apparatus mentioned above, when transferring the processed substrate within the load lock chamber to an outside thereof while transferring the new substrate to the inside thereof, an inactive gas such as nitrogen gas is introduced into the load lock chamber so as to increase the pressure in the load lock chamber to atmospheric pressure, and then the shutter is opened so as to carry out the bringing-in and bringing-out of the substrates.

Also, in the conventional art, in order to introduce the inactive gas, such as the nitrogen gas, into the load lock chamber, that nitrogen gas is directly introduced through a pipe from a gas bottle. However, when the gas is introduced directly from a gas bottle, it takes a rather long time to bring the interior atmosphere of the load lock chamber up to atmospheric pressure since the pipe from the gas bottle is narrow in diameter. This tendency is remarkable in particular when a plurality of processing apparatuses are provided and the nitrogen gas is supplied to the load lock chambers of each processing apparatus from only one gas bottle.

For resolving such problems mentioned above, in accordance with the present invention, a buffer tank having a capacity larger than that of the load lock chamber is provided in the path of a pipe for introducing the nitrogen gas into the load lock chamber of the processing apparatus.

However, in accordance with the present invention, if plural load lock chambers are provided, the capacity of the buffer tank must be larger than that of the total amount of all the load lock chambers which are provided.

Further, in accordance with the present invention, since a large amount of the inactive gas is introduced in a short time from an inlet of the load lock chamber, it is preferable to provide a filter at the inlet.

DESCRIPTION OF THE PREFERRED EMBODIMENTS

Figure 1:
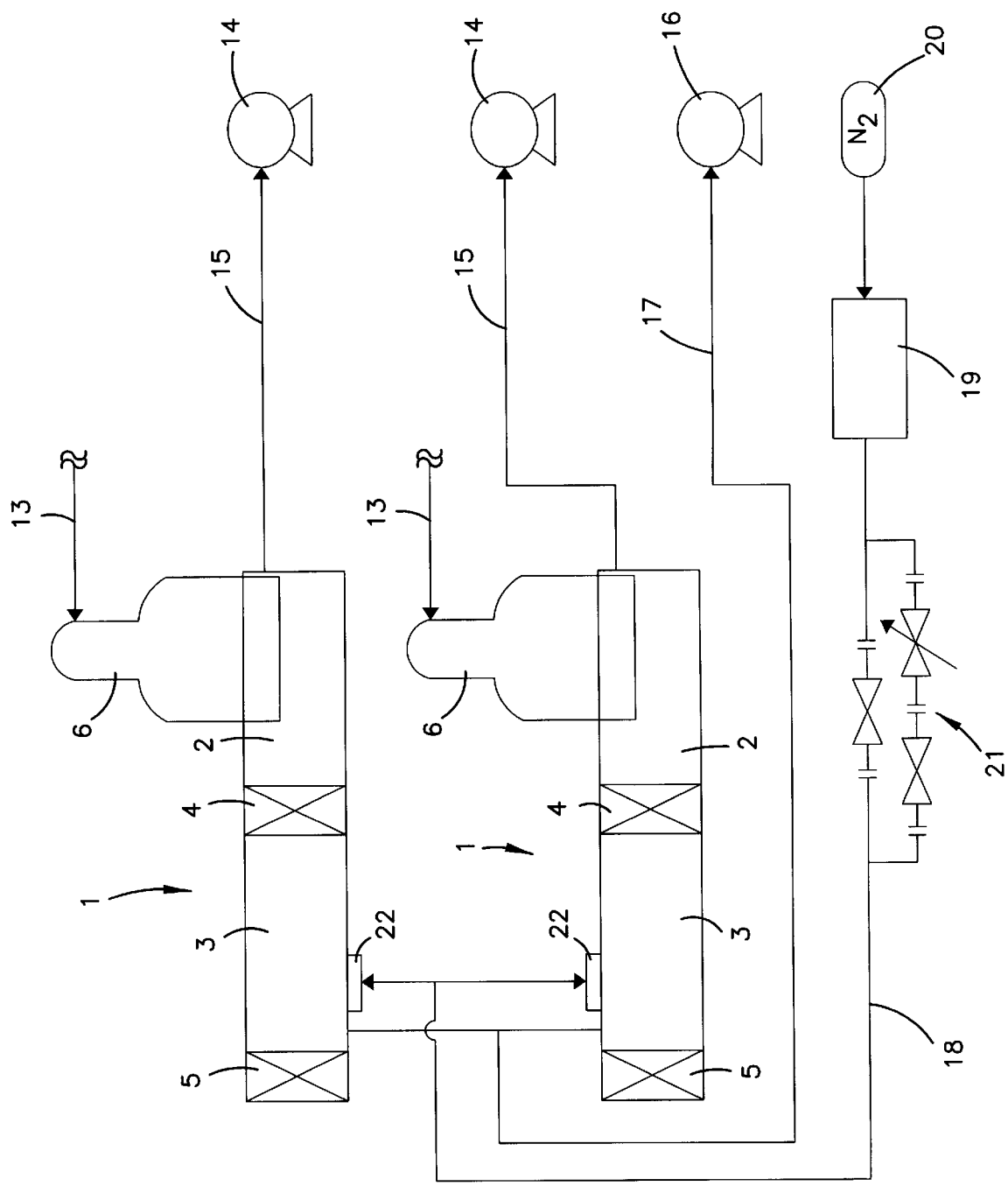
FIG. 1 is a schematic diagram showing a construction of a processing apparatus for substrates in accordance with the present invention.
Figure 2:
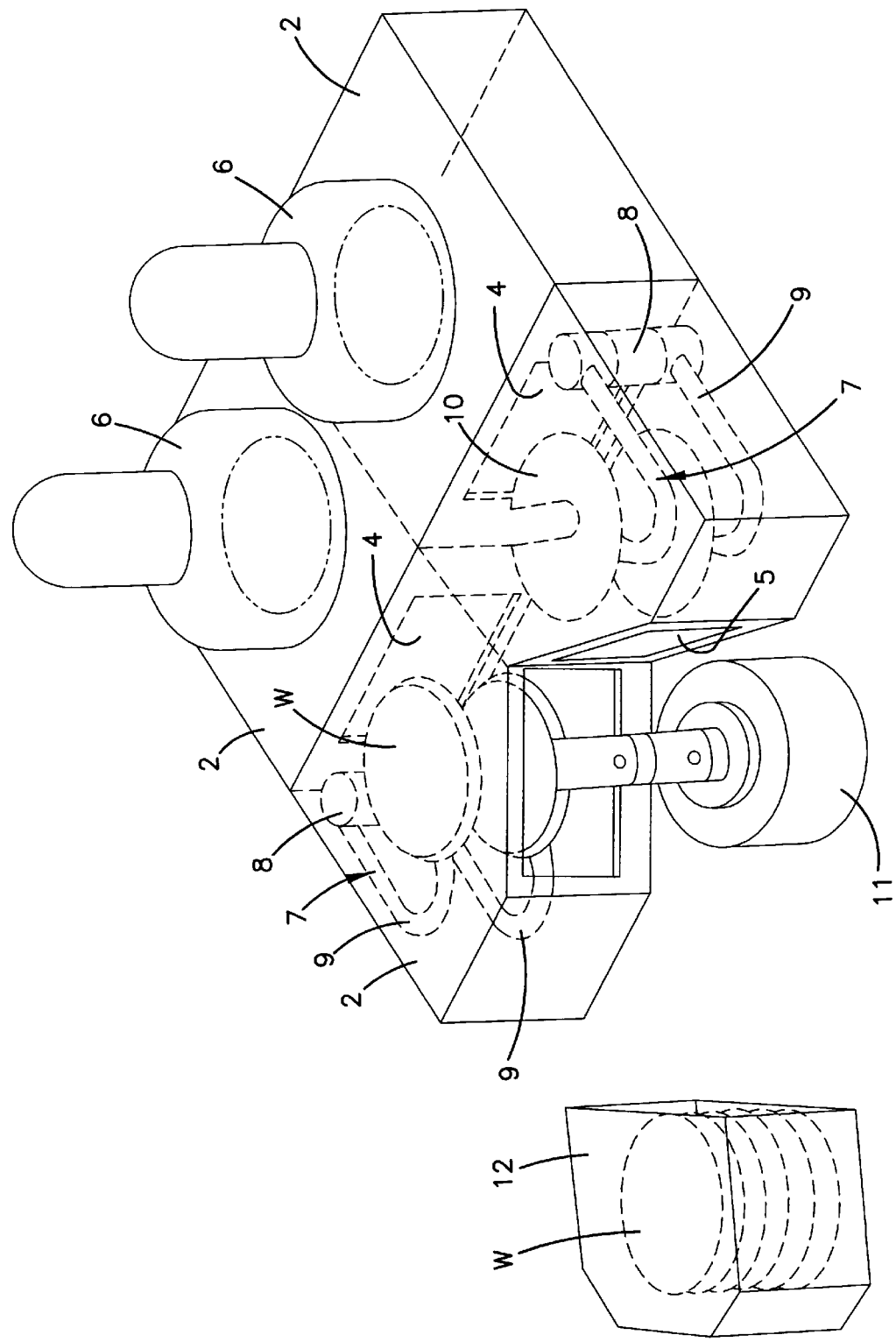
FIG. 2 is a perspective view of processing chambers and load lock chambers of the same processing apparatus for substrates in accordance with the present invention.

Hereinafter, detailed explanation of the embodiments in accordance with the present invention will be given by referring to the attached drawings. Here, FIG. 1 is a schematic diagram showing a construction of a processing apparatus for substrates in accordance with the present invention; and FIG. 2 is a perspective view of the processing chambers and the load lock chamber of the same processing apparatus for substrates.

In this embodiment, there are provided two sets of processing apparatuses 1. Each processing apparatus 1 is constructed with a processing chamber 2 and a load lock chamber 3, and a shutter 4 is provided between the processing chamber 2 and the load lock chamber 3. Further, another shutter 5 is provided between the load lock chamber 3 and the outside of the apparatus for hermetically sealing therebetween.

In processing chamber 2, there is provided a chamber 6, and at an upper half portion of a small diameter of the chamber 6 there is provided an electrode not shown in the drawing, thereby defining a plasma generating area, while a lower half portion of the large diameter of the chamber 6 defines a processing area.

Further, a handler unit 7 is positioned within the load lock chamber 3 for bringing a substrate W into the processing chamber 2 and also for bringing it out from the inside thereof. This handler unit 7 is constructed with two winding arms 9 which are supported at the base portions thereof onto a shaft 8 at upper and lower sides thereof, freely rotatable within a horizontal plane. In addition, at the edge of each arm 9, there is provided a hand portion 10.

Further, a conveyance robot 11 is provided between the two processing apparatuses 1, and thereby, the transfer of the substrate W between the handler unit 7 and a cassette 12 can be carried out by the conveyance robot 11.

Next, an explanation will be given of system of pipes. First, an inlet pipe 13 for a reaction gas is connected to the upper half portion of the chamber 6, while at the lower half portion thereof there is connected an exhaust pipe 15 which is connected to a vacuum pump 14 at the other end thereof.

To the load lock chamber 3 there is connected another exhaust pipe 17 which is connected to another vacuum pump 16. Furthermore, to the load lock chamber 3, there is connected an inlet pipe 18 for an inactive gas, such as the above-mentioned nitrogen gas. On the path of this inlet pipe 18 for the inactive gas there is provided a buffer tank 19 into which the inactive gas from a gas bottle 20 is supplied. However, the capacity of the buffer tank 19 is set to be larger than that of the total amount of the two load lock chambers 3 with respect to capacity.

Here, the capacity substantially means the volume. However, for reducing the size of the processing apparatus for substrates by making the volume of the buffer 19 smaller, the inactive gas can be introduced into the buffer tank 19 under the application of pressure. Furthermore, by applying the pressure onto the inactive gas, it also can achieve an effect whereby the introduction of the inactive gas into the load lock chamber 3 can be done in a shorter time period.

On the other hand, a buffer tank 19 may also be provided for each load lock chamber 3, on a one to one basis.

Furthermore, a valve mechanism 21 is provided at a point lower than the buffer tank 19 of the inlet pipe 18 for the inactive gas, and a filter 22 is provided at the inlet of the inactive gas into the load lock chamber 3.

An explanation of the operation of the apparatus of such construction as mentioned above will be given hereinafter. However, the explanation will be given only with respect to one of the processing chambers 2 and load lock chambers 3, and it is assumed that the process starts from a condition where an unprocessed substrate W is received within the processing chamber 2 and the shutters 4 and 5 are closed under a reduced pressure condition.

Under the condition mentioned above, predetermined treatments or processes of the ashing process are carried out upon the unprocessed substrate W in the processing chamber 2 under the reduced pressure condition, and then the shutter 4 is opened when those treatments are completed. At this time, the pressure in the processing chamber is the same to that in the load lock chamber.

Next, the substrate W which has been processed within the processing chamber 2 is received by operating the handler unit 7, and the processed substrate W is returned into the load lock chamber 3. After that, the next unprocessed substrate W which is waiting to be processed is inserted into the processing chamber 2 by operating the handler unit 7 again, so as to be transferred to a chuck within the processing chamber 2. Then, the shutter 4 is closed, and various treatments such as the ashing process can be carried out within the processing chamber 2 which is reduced in pressure to a predetermined reduced pressure.

Then, during the processes mentioned the above, the nitrogen gas is introduced into the load lock chamber 3 from the buffer tank 19 by operating the valve mechanism 21 so as to increase or pump up the pressure within the load lock chamber 3 up to atmospheric pressure. After that, the shutter 5 is opened, and the processed substrate W is taken out from inside of the load lock chamber 3 by operating the conveyance robot 11 so that it is returned to the cassette 12. In parallel thereto, the unprocessed substrate W within the cassette 12 is transferred into the load lock chamber 3.

When the processes mentioned above are completed, the shutter 5 is closed and the inside of the load lock chamber 3 is reduced in pressure again to the same pressure as that in the processing chamber 2. The load lock chamber 3 remains in the waiting condition until when the processes are completed within the processing chamber 2, and then similar operations as described above can be repeated when those processes within the processing chamber 2 are completed.

As is made fully clear in the description above, in accordance with the present invention, since a pipe for introducing the nitrogen gas is connected to the load lock chamber of the processing apparatus of substrates, in the path of which a buffer tank larger than the load lock chamber in capacity is provided, it is possible to bring the load lock chamber up to atmospheric pressure with the nitrogen gas in a very short time, thereby shortening the total processing time with the processing apparatus for substrates. Further, by applying pressure in the buffer tank, it is also possible to bring the load lock chamber to atmospheric pressure in a short time.

Further, in accordance with the present invention, the nitrogen gas is introduced into the load lock chamber in a very short time, and therefore, with the provision of the filter at the inlet thereof, the atmosphere in the load lock chamber can be prevented from disturbance therefrom.

What is claimed is:

1. A processing apparatus for processing a substrate comprising:
    a processing chamber for processing the substrate under conditions of reduced pressure;
    a load lock chamber neighboring said processing chamber, wherein a pipe for introducing an inactive gas is connected to said load lock chamber, and on a path of said pipe there is provided a buffer tank which is larger than said load lock chamber in capacity.

2. A processing apparatus for processing a substrate as described in claim 1, wherein said processing chamber and said load lock chamber are provided in plural, and the capacity of said buffer tank is set to be larger than a total capacity of said plurality of the load lock chambers.

3. A processing apparatus for processing a substrate as described in claim 1, wherein a filter is provided at an inlet opening for the inactive gas of said load lock chamber.

* * * * *